(12) United States Patent
Yamasaki et al.

(10) Patent No.: US 11,293,814 B2
(45) Date of Patent: Apr. 5, 2022

(54) TEMPERATURE MEASUREMENT MEMBER, INSPECTION APPARATUS, AND TEMPERATURE MEASUREMENT METHOD

(71) Applicant: TOKYO ELECTRON LIMITED, Tokyo (JP)

(72) Inventors: Yoshihito Yamasaki, Singapore (SG); Shinya Kurebayashi, Nirasaki (JP); Jun Mochizuki, Nirasaki (JP); Miyoko Kuroda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 292 days.

(21) Appl. No.: 16/720,586

(22) Filed: Dec. 19, 2019

(65) Prior Publication Data

US 2020/0209072 A1 Jul. 2, 2020

(30) Foreign Application Priority Data

Dec. 28, 2018 (JP) .............................. JP2018-246831

(51) Int. Cl.
*G01R 31/00* (2006.01)
*G01K 13/00* (2021.01)
(Continued)

(52) U.S. Cl.
CPC ............... *G01K 13/00* (2013.01); *G01K 1/14* (2013.01); *G01K 7/00* (2013.01); *G01R 1/07342* (2013.01);
(Continued)

(58) Field of Classification Search
CPC ......... H01L 2924/0002; H01L 2924/00; H01L 2224/48091; H01L 2224/48145;
(Continued)

(56) References Cited

U.S. PATENT DOCUMENTS

2020/0096561 A1\* 3/2020 Fujihara ............... G01R 1/0416
2020/0174060 A1\* 6/2020 Mochizuki ......... G01R 1/06794
2020/0408828 A1\* 12/2020 Kasai ................. G01R 31/2635

FOREIGN PATENT DOCUMENTS

JP 2007-227444 A 9/2007
JP 2016-66818 A 4/2016
(Continued)

*Primary Examiner* — Raul J Rios Russo
(74) *Attorney, Agent, or Firm* — Nath, Goldberg & Meyer; Jerald L. Meyer; Tanya E. Harkins (57) ABSTRACT

A temperature measurement member measures a temperature of an inspection object or a temperature of a mounting table on which the inspection object is placed inside an inspection apparatus that inspects the inspection object. The temperature measurement member is attached to an attachment position of a probe card used for electrical characteristic inspection in the inspection apparatus, and includes a main body having substantially a same shape as the probe card; a probe formed to extend from the main body toward the mounting table in a state in which the temperature measurement member is attached to the attachment position; and a temperature sensor configured to measure the temperature of the inspection object or the mounting table. The sensor transmits/receives a temperature measurement-related electrical signal to/from an inspection part via the probe card in the electrical characteristic inspection, and transmits a temperature measurement result to the inspection part.

10 Claims, 5 Drawing Sheets

(51) Int. Cl.
  *G01R 31/26* (2020.01)
  *G01K 7/00* (2006.01)
  *G01R 1/073* (2006.01)
  *G01K 1/14* (2021.01)
  *G01R 31/28* (2006.01)
  *G01K 11/00* (2006.01)
  *G01K 7/18* (2006.01)

(52) U.S. Cl.
  CPC .......... *G01R 31/002* (2013.01); *G01R 31/26* (2013.01); *G01R 31/2601* (2013.01); *G01R 31/2621* (2013.01); *G01R 31/2834* (2013.01); *G01R 31/2851* (2013.01); *G01R 31/2874* (2013.01); *G01R 31/2887* (2013.01); *G01R 31/2891* (2013.01); *G01K 7/18* (2013.01); *G01K 11/00* (2013.01); *H01L 2224/48091* (2013.01); *H01L 2224/48145* (2013.01); *H01L 2924/00* (2013.01); *H01L 2924/0002* (2013.01)

(58) Field of Classification Search
  CPC .......... H01L 22/12; H01L 22/14; H01L 22/30; G01R 31/2834; G01R 31/2851; G01R 31/002; G01R 31/2621; G01R 1/07342; G01R 31/26; G01R 31/2601; G01R 31/2874; G01R 31/2887; G01R 31/2891; G01R 1/07307; G01K 13/00; G01K 1/14; G01K 7/00; G01K 7/18; G01K 11/00; G01K 1/02
  USPC ......... 324/71, 378, 403, 415, 425, 500, 537, 324/750.01
  See application file for complete search history.

(56) References Cited

FOREIGN PATENT DOCUMENTS

| | | |
|---|---|---|
| JP | 2016-181601 A | 10/2016 |
| JP | 2018-148066 A | 9/2018 |

* cited by examiner

TEMPERATURE MEASUREMENT MEMBER, INSPECTION APPARATUS, AND TEMPERATURE MEASUREMENT METHOD

CROSS-REFERENCE TO RELATED APPLICATION

This application is based upon and claims the benefit of priority from Japanese Patent Application No. 2018-246831, filed on Dec. 28, 2018, the entire contents of which are incorporated herein by reference.

TECHNICAL FIELD

The present disclosure relates to a temperature measurement member, an inspection apparatus, and a temperature measurement method.

BACKGROUND

Patent Document 1 discloses a method of preheating a probe card in a short period of time when electrical characteristic inspection of a wafer is performed using a wafer inspection apparatus. More specifically, in Patent Document 1, a wafer inspection apparatus includes an inspection chamber in which the electrical characteristic inspection is performed. The inspection chamber includes a probe card having a plurality of probes, a seal member provided to surround the plurality of probes, a temperature-adjustable lifting body configured to raise the wafer so as to bring the wafer into contact with the seal member, and an exhaust mechanism configured to evacuate a sealed space formed by the wafer, the seal member, and the probe card. The preheating method disclosed in Patent Document 1 includes a step of bringing the wafer into contact with the seal member by lifting the wafer via the lifting body, a step of causing the wafer to be adsorbed to the probe card by reducing the pressure of the sealed space via the exhaust mechanism, and a step of preheating the probe card by the lifting body by lowering the lifting body and then raising the lifting body again so as to bring the plurality of probes into contact with an upper surface of the wafer.

PRIOR ART DOCUMENT

Patent Document

Patent Document 1: Japanese Laid-Open Patent Publication No. 2016-066818

SUMMARY

According to an embodiment of the present disclosure, there is provided a temperature measurement member that measures a temperature of an inspection object or a temperature of a mounting table on which the inspection object is placed inside an inspection apparatus that inspects the inspection object, wherein the temperature measurement member is attached to an attachment position of a probe card used for electrical characteristic inspection in the inspection apparatus, wherein the temperature measurement member includes: a main body having substantially a same shape as the probe card; a probe formed to extend from the main body toward the mounting table in a state in which the temperature measurement member is attached to the attachment position; and a temperature sensor provided at a tip end of the probe and configured to measure the temperature of the inspection object or the mounting table, which is a temperature measurement object, and wherein the temperature sensor transmits/receives a temperature measurement-related electrical signal to/from an inspection part that transmits/receives the electrical signal to/from the inspection object via the probe card in the electrical characteristic inspection, and transmits a temperature measurement result to the inspection part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor manufacturing process, a plurality of electronic devices having a predetermined circuit pattern is formed on a semiconductor wafer (hereinafter, referred to as a "wafer"). The formed electronic devices are subjected to an electrical characteristic inspection or the like, so that they are sorted into good-quality products and defective products. The inspection of the electronic devices is performed using an inspection apparatus, for example, in the state of the wafer before the electronic devices are divided.

An electronic device inspection apparatus called a prober or the like is provided with a probe card having probes as a number of terminals. In addition, the inspection apparatus includes an alignment part and an inspection part. The alignment part aligns and brings probes provided on the probe card into contact with respective electrodes of electronic devices formed on a wafer. The inspection part transmits and receives electrical signals for inspecting electrical characteristics to and from the electronic devices via the probes. Based on the electrical signals from the electronic devices detected by the inspection part, it is determined whether or not the respective electronic device is defective.

In recent inspection apparatuses, there have been cases where an apparatus is provided with a means for adjusting a temperature of the wafer such that the electrical characteristics of electronic devices can be inspected at high and low temperatures. In Patent Document 1, the lifting body that raises the wafer is configured to be adjusted in temperature, and thus the wafer is heated by the lifting body.

As described above, in the case of adjusting the temperature of the wafer, it is necessary to check whether the temperature adjustment is accurately performed. In addition, in the case where the temperature adjustment of the wafer is performed by a temperature-adjustable member, such as the lifting body of Patent Document 1, it is necessary to check whether the temperature adjustment of the member is accurately performed.

Thus, in order to check whether or not the temperature of the object, which is subject to the temperature adjustment, is accurately adjusted, a temperature measurement is periodically performed on the temperature adjustment object in a temperature-adjusted state. Such a temperature measurement is performed using a thermocouple thermometer, for example, after the user manually detaches the above-described inspection part or probe card. However, such a temperature measurement method requires great care and thus takes a long period of time. Further, when the temperature is adjusted to a high temperature, there is a risk of a burn injury to the user with the above-described temperature measurement method. On the other hand, when the temperature is adjusted to a low temperature, it is necessary to take measures to prevent dew condensation from occurring inside the apparatus. Performance of such tasks requires some time, which results in a prolonged period of time for the temperature adjustment.

Therefore, the technique according to the present disclosure enables temperature measurements for checking whether or not temperature adjustment of a temperature adjustment object is accurately performed inside an inspection apparatus, to be safely performed in a short period of time.

Hereinafter, a temperature measurement member, an inspection apparatus, and a temperature measurement method according to the present embodiment will be described with reference to the drawings. In the specification and drawings, elements having substantially the same functional configurations will be denoted by the same reference numerals and redundant explanations thereof will be omitted.

Figure 1:
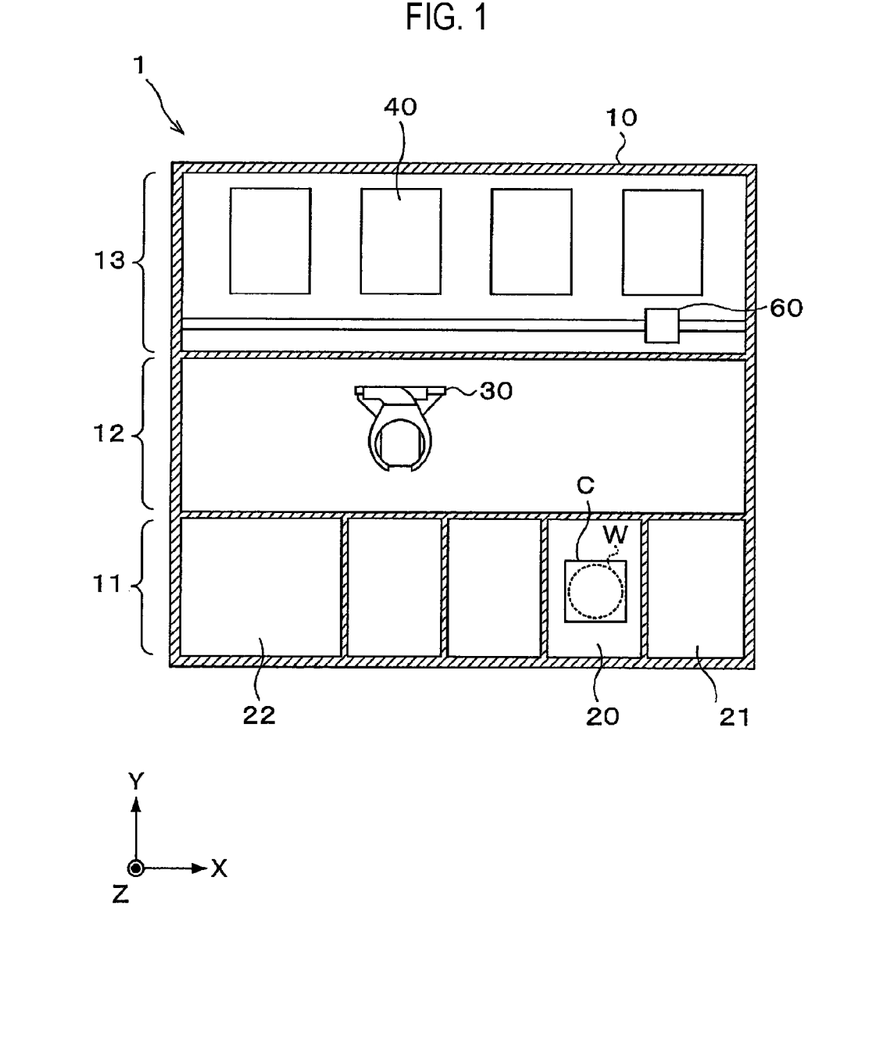
FIG. 1 is a horizontal cross-sectional view schematically illustrating a configuration of an inspection apparatus according to an embodiment.
Figure 2:
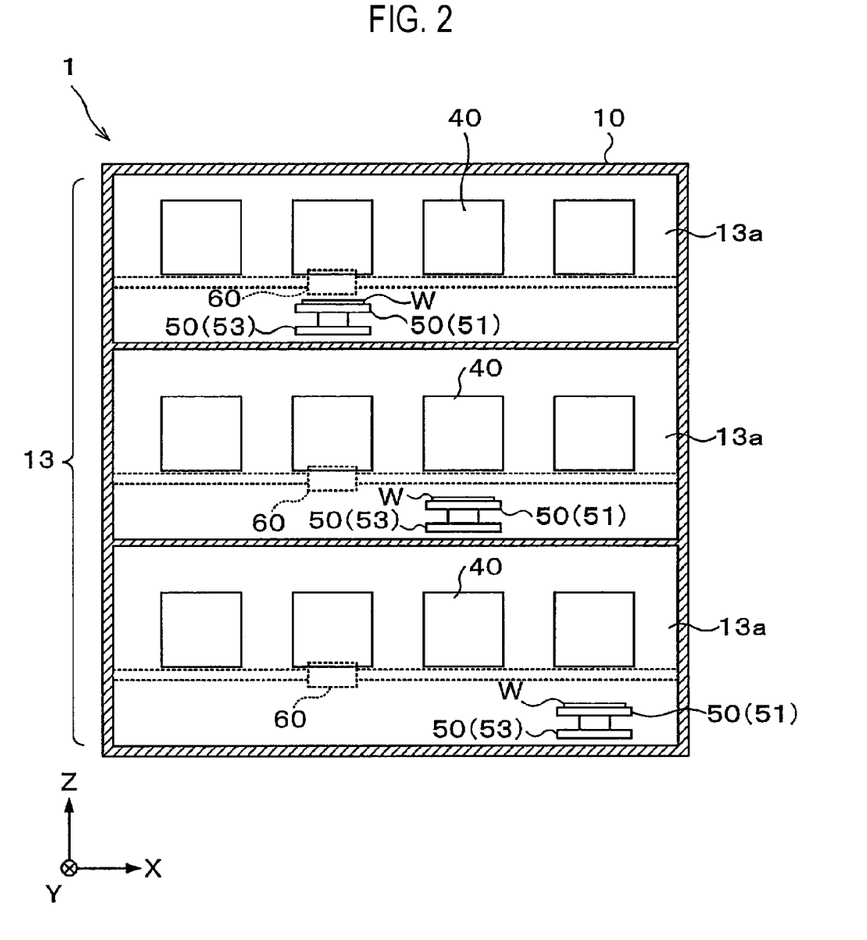
FIG. 2 is a vertical cross-sectional view schematically illustrating a configuration of the inspection apparatus according to the embodiment.

FIG. 1 and FIG. 2 are a horizontal cross-sectional view and a vertical cross-sectional view, respectively, which schematically illustrate a configuration of the inspection apparatus according to an embodiment.

As illustrated in FIGS. 1 and 2, the inspection apparatus 1 includes a housing 10. A loading/unloading area 11, a transfer area 12, and an inspection area 13 are provided in the housing 10. In the inspection apparatus 1, the loading/unloading area 11 is an area in which a wafer W as an inspection object is loaded to or unloaded from, or an area in which a probe card and a probe card type temperature measurement member (both to be described later) are loaded to or unloaded from. The transfer area 12 is an area that connects the loading/unloading area 11 and the inspection area 13. The inspection area 13 is an area in which the electrical characteristic inspection of electronic devices formed on the wafer W is performed.

The loading/unloading area 11 is provided with a port 20 configured to receive a cassette C accommodating a plurality of wafers W, a loader 21 configured to accommodate a probe card and a probe card type temperature measurement member therein, and a controller 22 configured to control each component of the inspection apparatus 1.

The controller 22 is composed of a computer including, for example, a CPU and memory, and includes a program storage part (not illustrated). The program storage part stores a program for controlling various processes performed by the inspection apparatus 1. The program may be recorded in a non-transitory computer-readable storage medium, and may be installed in the controller 22 from the storage medium.

A transfer device 30 configured to be freely movable while holding the wafer W or the like is disposed in the transfer area 12. The transfer device 30 transfers the wafer W between the cassette C in the port 20 of the loading/unloading area 11 and the inspection area 13. In addition, the transfer device 30 transfers a probe card that requires maintenance among probe cards fixed to a pogo frame (to be described later) in the inspection area 13 to the loader 21 in the loading/unloading area 11. In addition, the transfer device 30 transfers a new probe card or a probe card subjected to the maintenance, from the loader 21 to the pogo frame in the inspection area 13. Furthermore, the transfer device 30 transfers the probe card type temperature measurement member from the loader 21 to the pogo frame in the inspection area 13, or transfers the probe card type temperature measurement member from the pogo frame to the loader 21.

The inspection area 13 is provided with a plurality of testers 40 as inspection parts. Specifically, as illustrated in FIG. 2, the inspection area 13 is divided into three regions 13a in a vertical direction. A tester row composed of four testers 40 arranged in a horizontal direction (the X direction in FIG. 2) is provided in each of the divided regions 13a. In addition, each of the divided regions 13a is provided with an alignment part 50 and a camera 60. The numbers and arrangements of the testers 40, alignment parts 50, and cameras 60 may be arbitrarily selected.

A tester 40 transmits/receives electrical signals for electrical characteristic inspection to and from the wafer W via the probe card or the like. In the present embodiment, the tester 40 further transmits/receives electrical signals related to temperature measurements to and from a temperature sensor provided in a probe card type temperature measurement member (to be described later).

The alignment part 50 is configured to place the wafer W thereon, and to align the placed wafer W and the probe card disposed below the tester 40 with each other. The alignment part 50 is provided to be movable in an area below the tester 40.

The camera 60 moves horizontally and is positioned in front of each tester 40 in the divided region 13a in which the camera 60 is provided. The camera 60 images a positional relationship between the probe card disposed below the tester 40 and the wafer W placed on the alignment part 50.

In the inspection apparatus 1, while the transfer device 30 transfers one wafer W toward one tester 40, another testers 40 can inspect the electrical characteristics of electronic devices formed on another wafer W.

Figure 3:
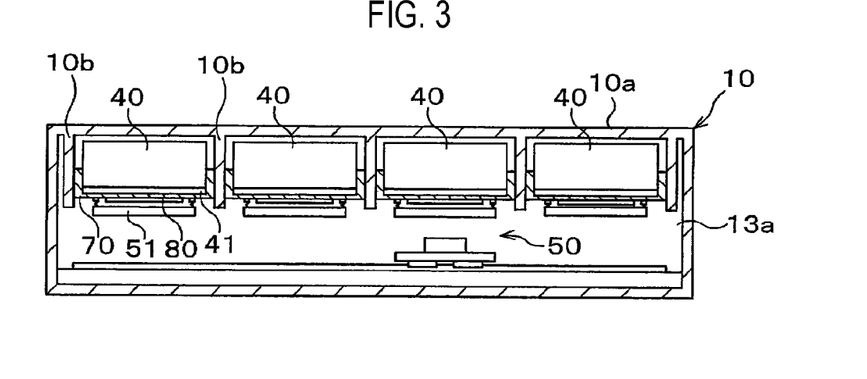
FIG. 3 is a vertical cross-sectional view illustrating an internal configuration of each divided region.
Figure 4:
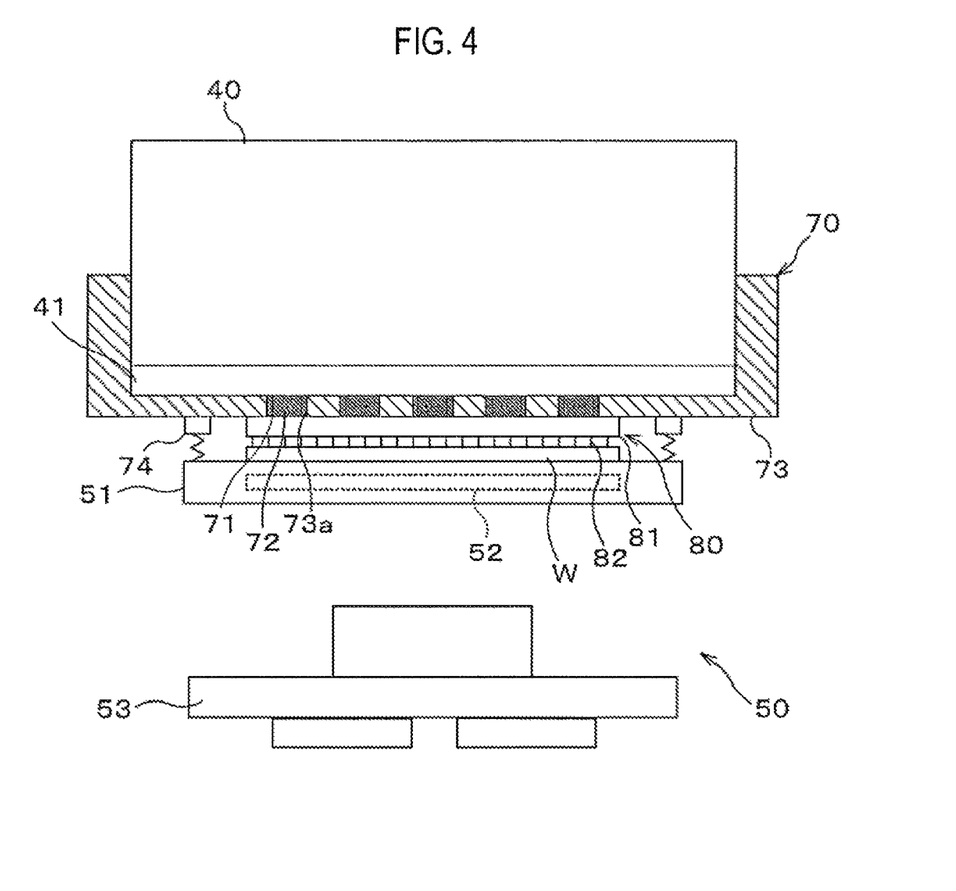
FIG. 4 is a partially enlarged view of FIG. 3.

Next, configurations related to the tester 40 and the alignment part 50 will be described with reference to FIGS. 3 and 4. FIG. 3 is a vertical cross-sectional view illustrating an internal configuration of each divided region 13a. FIG. 4 is a partially enlarged view of FIG. 3.

As illustrated in FIGS. 3 and 4, each tester 40 includes a tester motherboard 41 provided horizontally on a bottom portion thereof. A plurality of test circuit boards (not illustrated) are mounted upright on the tester motherboard 41. A plurality of electrodes are provided on a bottom surface of the tester motherboard 41.

Below the tester 40, a pogo frame 70 and a probe card 80 are provided in this order from the upper side at the time of electrical characteristic inspection.

Around the tester 40, a plurality of support walls 10b extend downward in the vertical direction from an upper wall 10a forming each divided region 13a. The pogo frame 70 is mounted on lower portions of the support walls 10b facing each other. Each tester 40 is supported by the support walls 10b facing each other and the pogo frame 70 mounted between the support walls 10b.

The pogo frame 70 supports the probe card 80 and electrically connects the probe card 80 and the tester 40 at the time of electrical characteristic inspection. The pogo frame 70 is located between the tester 40 and the probe card 80. The pogo frame 70 includes a pogo block 72 configured to hold a number of pogo pins 71, and a frame body 73 having attachment holes 73a to which the pogo pins 71 are attached by inserting the pogo block 72 into the frame body 73.

The probe card 80 is vacuum-attracted to the lower surface of the pogo frame 70 in a state where the probe card 80 is aligned at a predetermined position.

In addition, a bellows 74 extending vertically downward is attached to a lower surface of the pogo frame 70 so as to surround the attachment position of the probe card 80. The bellows 74 is provided to form a sealed space including the probe card 80 and the wafer W in the state in which the wafer W on a chuck top (to be described later) is in contact with the probes (to be described later) of the probe card 80, for example, during the electrical characteristic inspection. The bellows 74 may form a sealed space including a probe card type temperature measurement member at the time of temperature measurement for checking the operation of the chuck top.

In addition, a lower end of each pogo pin 71 of the pogo frame 70 is brought into contact with a respective electrode pad on an upper surface of a card body 81 (to be described later) of the probe card 80 by virtue of a vacuum attraction force acting on the pogo frame 70, the probe card 80, or the like by a vacuum mechanism (not illustrated). Furthermore, an upper end of each pogo pin 71 is pressed against a respective electrode on the lower surface of the tester motherboard 41 by virtue of the vacuum attraction force.

The probe card 80 includes the card body 81 having a disk shape, the plurality of electrode pads (not illustrated) provided on the upper surface of the card body 81, and a plurality of probes 82 which are needle-shaped terminals. The plurality of probes 82 extend downward from the lower surface of the card body 81. The above-mentioned electrodes provided on the upper surface of the card body 81 are electrically connected to the respective probes 82. In addition, at the time of electrical characteristic inspection, the probes 82 come into contact with respective electrode pads or solder bumps in the electronic devices formed on the wafer W. Therefore, at the time of electrical characteristic inspection, electrical signals for inspection are transmitted and received between the tester motherboard 41 and the electronic devices on the wafer W via the pogo pins 71, the electrodes provided on the upper surface of the card body 81, and the probes 82.

The alignment part 50 includes a chuck top 51 as a stage configured to attract the wafer W placed thereon, and an aligner 53.

A temperature adjustment mechanism 52 is embedded in the chuck top 51. The temperature adjustment mechanism 52 adjusts the temperature of the chuck top 51 during the electrical characteristic inspection, whereby the temperature of the wafer W placed on the chuck top 51 during the electrical characteristic inspection may be adjusted to a temperature falling within a range of, for example, −30 degrees C. to +130 degrees C.

The aligner 53 supports the chuck top 51 and moves the chuck top 51 in an up-down direction (Z direction in the figures), a front-rear direction (Y direction in the figures), and a left-right direction (X direction in the figures).

A sealed space including the probe card 80 and the wafer W is formed in the state in which the wafer W on the chuck top 51 and the probes 82 of the probe card 80 are brought into contact with each other by the alignment performed by the alignment part 50. The sealed space is evacuated by a vacuum mechanism (not illustrated). At this time, by moving the aligner 53 downward, the chuck top 51 is separated from the aligner 53 and is attracted to the side of the pogo frame 70.

Further, when the probe card 80 and the probe card type temperature measurement member are attached by vacuum attraction, the aligner 53 of the alignment part 50 may deliver the probe card 80 and the probe card type temperature measurement member to and from the transfer device 30, or may move the probe card 80 and the probe card type temperature measurement member in the front-rear direction and the left-right direction.

In the present embodiment, the aligner 53 and the transfer device 30 function as a transfer part.

In the inspection apparatus 1 configured as described above, for example, in order to check whether or not the temperature adjustment of the chuck top 51 is accurately performed by the temperature adjustment mechanism 52, the temperature measurement of the chuck top 51 is performed by the probe card type temperature measurement member described below is used.

Figure 5:
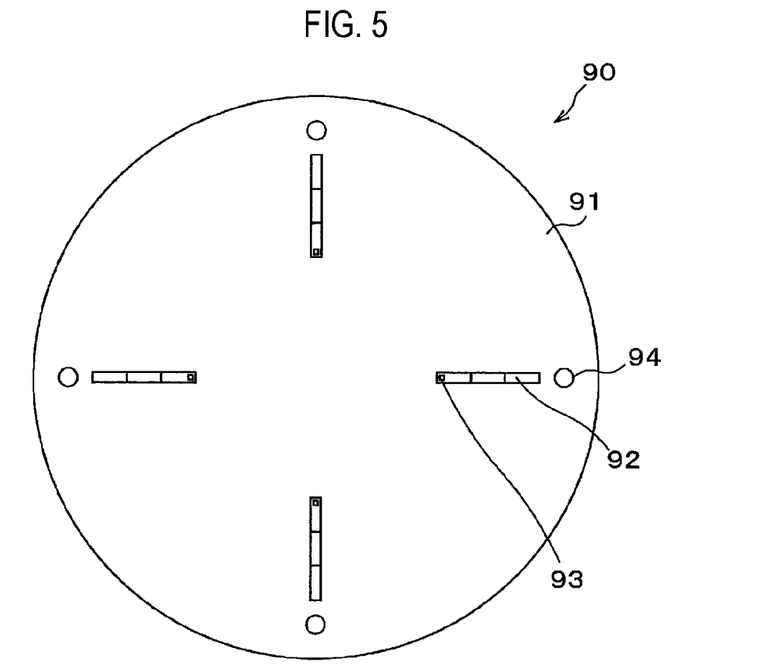
FIG. 5 is a plan view illustrating an example of a probe card type temperature measurement member.
Figure 6:
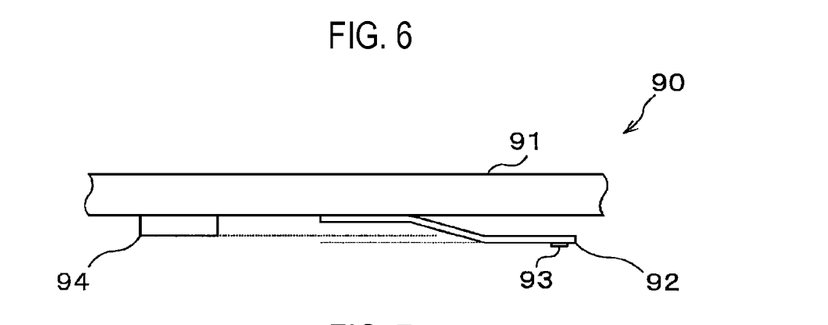
FIG. 6 is a partially enlarged side view for explaining the example of the probe card type temperature measurement member.
Figure 7:
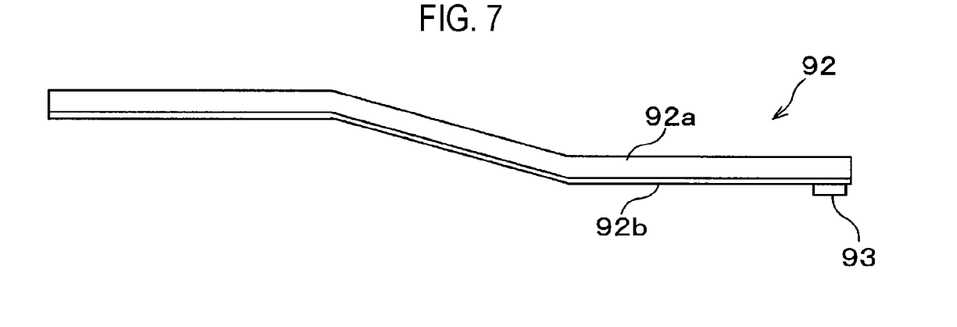
FIG. 7 is a side view for explaining an example of a probe included in the probe-type temperature measurement member.
Figure 8:
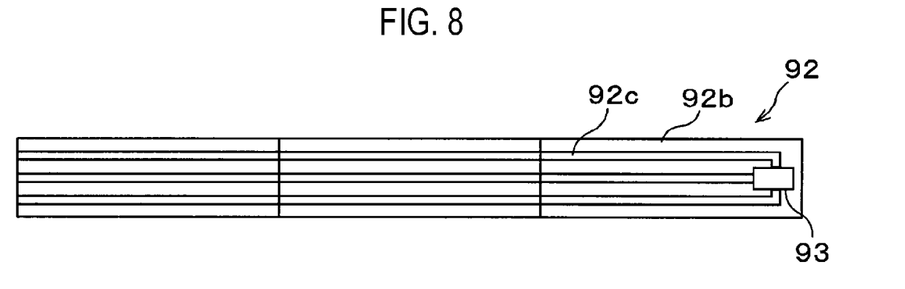
FIG. 8 is a plan view for explaining the example of the probe included in the probe-type temperature measurement member.
Figure 9:
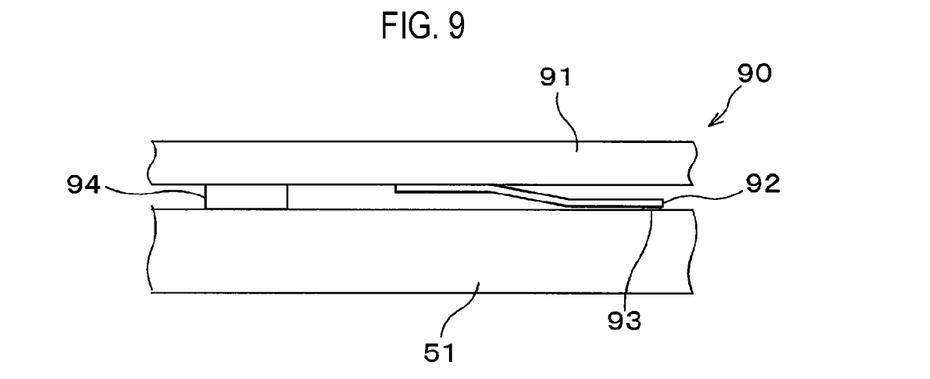
FIG. 9 is a partially enlarged side view for explaining an example of a stopper included in the probe card type temperature measurement member.

FIGS. 5 and 6 are a plan view and a partially enlarged side view, respectively, that illustrate an example of the probe card type temperature measurement member. FIGS. 7 and 8 are an enlarged side view and a plan view, respectively, for explaining probes included in the probe type temperature measurement member. FIG. 9 is a side view for explaining a stopper to be described later.

A probe card type temperature measurement member 90 illustrated in FIGS. 5 and 6 is used by being attached to the attachment position of the probe card 80. The probe card type temperature measurement member 90 includes a main body 91, probes 92, digital temperature sensors 93 as temperature sensors, and stoppers 94.

The main body 91 is formed in substantially the same shape as the probe card 80. Specifically, the main body 91 is formed in a circular shape, which is substantially the same shape as the card body 81 of the probe card 80. In addition, the shape of the main body 91 may be any shape as long as the probe card temperature measurement member 90 can be attached to the attachment position of the probe card 80 and can be transferred by the transfer device 30. Alternatively, the shape of the main body 91 may be the same as or different from the shape of the card body 81 of the probe card 80. A material used for the main body 91 may be the same as that of the card body 81 of the probe card 80.

The probes 92 are formed in a needle shape so as to extend in a direction from the main body 91 toward the chuck top 51 (downward in FIG. 6) in a state in which the probe card type temperature measurement member 90 is attached to the attachment position of the probe card 80.

The digital temperature sensor 93 provided at the tip end of each probe 92 measures a temperature of the chuck top 51 and outputs a temperature measurement result as a digital signal.

In addition, each probe 92 is configured to be flexible. In this example, as illustrated in FIG. 7, each probe 92 is formed by bonding a leaf spring member 92a and a flexible printed circuit board (hereinafter, referred to as an "FPC board") 92b.

Furthermore, as illustrated in FIG. 8, the probe 92 includes wiring patterns 92c electrically connected to the digital temperature sensor 93. Specifically, the wiring patterns 92c are formed on the FPC board 92b of the probe 92. Each end of the wiring patterns 92c opposite the digital temperature sensor 93 is electrically connected to an electrode pad (not illustrated) provided on a surface opposite a surface (upper surface) on the side of the probe 92 of the main body 91. During the temperature measurement of the chuck top 51 by the digital temperature sensor 93, electrical signals relating to the temperature measurement are transmitted and received between the tester 40 and the digital temperature sensor 93 via the pogo pins 71, the electrode pads provided on the upper surface of the main body 91, and the wiring patterns 92c of the probe 92.

The stopper 94 is provided to maintain a distance between the chuck top 51 and the main body 91 at a predetermined level or more. As illustrated in FIG. 9, even when the digital temperature sensor 93 and the chuck top 51 are in contact with each other, the distance between the chuck top 51 and the main body 91 is maintained at the predetermined level or more. Thus, it is possible to prevent the probe 92 from being greatly bent and damaged.

In addition, in a state where the digital temperature sensor 93 and the chuck top 51 are not in contact with each other, an end (a lower end in FIG. 6) on the side of the chuck top 51 in the stopper 94 is located closer to the main body 91 (an upper side in FIG. 6) than an end (a lower end in FIG. 6) on the side of the chuck top 51 in the digital temperature sensor 93. Therefore, there is no occasion for the stopper 94 to interfere with the contact between the digital temperature sensor 93 and the chuck top 51.

Next, an exemplary inspection process using the inspection apparatus 1 will be described. In the following description, it is assumed that the inspection process is started from the state in which the chuck tops 51, on each of which the wafer W is not mounted, are attached to all the testers 40, namely all the pogo frames 70.

(Preliminary Temperature Adjustment)

In the electrical characteristic inspection, first, a temperature adjustment of the probe card 80 is performed prior to the electrical characteristic inspection. Specifically, the temperature of the chuck top 51, on which no wafer W is placed and which is attracted to the pogo frame 70, is adjusted to a temperature corresponding to a set temperature of the wafer W at the time of electrical characteristic inspection (hereinafter, referred to as "chuck top set temperature"). A preliminary temperature adjustment of the probe card 80 is performed by supplying heat from the temperature-adjusted chuck top 51 or by absorbing heat by the respective chuck top 51. Upon completing such a preliminary temperature adjustment, the attraction of the chuck top 51 is released so that the chuck top 51 is placed on the aligner 53.

(Alignment)

After the preliminary temperature adjustment of the probe card 80, a wafer W to be inspected and the probe card 80 are aligned with each other. Specifically, the wafer W is taken out from the cassette C in the port 20 of the loading/unloading area 11 by the transfer device 30 or the like, loaded into the inspection area 13, and placed on the chuck top 51 on the aligner 53. Next, the aligner 53, the camera 60, and the like are controlled so as to align the wafer W on the chuck top 51 and the probe card 80 in the horizontal direction. Subsequently, the chuck top 51 is raised until the probes 82 of the probe card 80 come into contact with the electrodes of the electronic devices formed on the wafer W. Thereafter, in the state in which the probes 82 and the electrodes are in contact with each other, a vacuum mechanism (not illustrated) and the like are controlled to lower the aligner 53. Thus, the chuck top 51 is separated from the aligner 53 and is attracted to the pogo frame 70.

Further, prior to bringing the probes 82 into contact with the electrodes of the electronic devices, the temperature adjustment mechanism 52 is controlled to adjust the temperature of the wafer W to a wafer set temperature at the time of electrical characteristic inspection.

(Inspection)

Then, electrical signals for electrical characteristic inspection is inputted from the tester 40 to the probes 82 via the pogo pins 71 and the like, so that the electrical characteristic inspection of the electronic devices is started. During the inspection, the temperature adjustment mechanism 52 is controlled to adjust the temperature of the wafer W placed on the chuck top 51 to a predetermined set temperature.

When the electrical characteristic inspection is completed, the aligner 53, the transfer device 30, and the like are controlled such that the wafer W is delivered to the aligner 53 together with the chuck top 51, and is returned to the cassette C in the port 20 from the chuck top 51 by the transfer device 30.

Then, a next wafer W to be inspected is taken out from the cassette C. The next wafer is subjected to the above-described alignment step and inspection step. When the wafer set temperature of the wafer W is changed, the above-described preliminary temperature adjustment step may be performed prior to the alignment step as necessary.

During the inspection by one tester 40, the aligner 53 transfers a wafer W to another tester 40, and collects a wafer W from another tester 40.

Next, an exemplary temperature measurement process of the chuck top 51 performed in the inspection apparatus 1 in order to check the accuracy of temperature adjustment will be described.

(Detachment of Probe Card 80)

The temperature measurement of the chuck top 51 according to the present embodiment is performed using the above-described probe card type temperature measurement member 90 attached to the attachment position of the probe card 80. First, the probe card 80 is detached. Specifically, when the wafer W as the inspection object is returned to the cassette C in the port 20 after the inspection is terminated, a subsequent wafer W as a next inspection object is not taken out, but an attachment and detachment jig (not illustrated) for the probe card 80 is taken out from the loader 21 by the transfer device 30. The attachment and detachment jig (hereinafter, simply referred to as a "jig") is loaded into the inspection area 13 by the transfer device 30 and is placed on the chuck top 51. Subsequently, the chuck top 51 on which the jig is placed is moved to a predetermined position in the horizontal direction by the aligner 53 and is then raised. Thereafter, a vacuum mechanism (not illustrated) is controlled to release the attraction of the probe card 80, and place the probe card 80 on the jig provided on the chuck top 51. Then, the probe card 80 is unloaded to the loader 21 by the aligner 53 and the transfer device 30 together with the jig.

(Attachment of Probe Card Type Temperature Measurement Member 90)

Next, the probe card type temperature measurement member 90 is attached to the attachment position from which the probe card 80 is detached. Specifically, the probe card type temperature measurement member 90 is taken out from the loader 21 by the transfer device 30 in the state of being placed on the attachment and detachment jig (not illustrated) for the probe card type temperature measurement member 90. The attachment and detachment jig (hereinafter, simply referred to as a "jig") is loaded into the inspection area 13 by the transfer device 30 and is placed on the chuck top 51. Next, the chuck top 51 on which the jig is placed is moved to the above-mentioned predetermined position in the horizontal direction by the aligner 53 and is then raised. Thereafter, the vacuum mechanism (not illustrated) is controlled, and the probe card type temperature measurement member 90 on the jig is attracted to the pogo frame 70. Thereby, the probe card type temperature measurement member 90 is attached to the attachment position of the probe card 80. Thereafter, the jig on which the probe card type temperature measurement member 90 is not placed is unloaded to the loader 21 by the aligner 53 and the transfer device 30. As the attachment and detachment jig for the probe card temperature measurement member 90, a jig, which is the same as the attachment and detachment jig for the probe card 80, may be used.

(Temperature Adjustment of Chuck Top 51)

Next, the chuck top 51 is adjusted to have a predetermined temperature by the temperature adjustment mechanism 52. Specifically, first, the chuck top 51 is raised after being aligned with respect to the probe card type temperature measurement member 90 in the horizontal direction by the aligner 53. Thereafter, the vacuum mechanism (not illustrated) is controlled and the aligner 53 is lowered, whereby the chuck top 51 is separated from the aligner 53 and is attracted to the pogo frame 70. The chuck top 51 is adjusted to a predetermined temperature by the temperature adjustment mechanism 52 before or after the attraction step of the chuck top 51 or in parallel with the attraction step.

(Temperature Measurement of Chuck Top 51)

Next, the temperature of the temperature-adjusted chuck top 51 is measured by the digital temperature sensors 93. Specifically, the vacuum attraction force by the vacuum mechanism (not illustrated) is increased, and the position of the chuck top 51 is raised. Thus, the digital temperature sensors 93, provided at the tip ends of the probes 92 of the probe card type temperature measurement member 90, come into contact with the chuck top 51. In addition, the digital temperature sensors 93 may also come into contact with the chuck top 51 when the chuck top 51 is attracted to pogo frame 70.

After the digital temperature sensors 93 are brought into contact with the chuck top 51, electric power is supplied from the tester 40 to the digital temperature sensors 93. The number of electronic devices to be inspected by the tester 40 is different from the number of digital temperature sensors 93, and the same number electrodes are provided on the lower surface of the tester 40 as the number of electronic devices to be inspected by the tester 40. Therefore, at the time of temperature measurement, power from the tester 40 is supplied only to portions corresponding to the digital temperature sensors 93 among the electrodes. The electric power supplied to the electrodes on the lower surface of the tester 40 is supplied to the digital temperature sensors 93 via the pogo pins 71 and the wiring patterns 92*c* of the probes 92 of the probe card type temperature measurement member 90.

When electric power is supplied from the tester 40 to the digital temperature sensors 93, the temperature of the chuck top 51 is measured by the digital temperature sensors 93 by heat absorption by the chuck top 51. The measurement result is sent as digital signals from the digital temperature sensors 93 to the tester 40 via the wiring patterns 92*c* or the like.

The measurement result is used for calibration of temperature adjustment by the temperature adjustment mechanism 52 based on, for example, the control of the controller 22. Further, based on the measurement result data, the tester 40 and the controller 22 may analyze the data or perform failure prediction based on the data.

In addition, the measurement result may be displayed on a display part of the controller 22.

(Detachment of Probe Card Type Temperature Measurement Member 90 and Attachment of Probe Card 80)

After measuring the temperature of the chuck top 51, the attachment of the probe card type temperature measurement member 90 is performed in the same manner as the detachment of the probe card 80 described above, and the attachment of the probe card 80 is performed in the same manner as the probe card type temperature measurement member 90 described above. Thereafter, the inspection using the probe card 80 is resumed.

As described above, in the present embodiment, the main body 91 of the probe card type temperature measurement member 90 has the same shape as the card body 81 of the probe card 80. That is, the probe card type temperature measurement member 90 and the probe card 80 have the same shape. Therefore, the probe card type temperature measurement member 90 may be transferred by the transfer device 30 in the same manner as the probe card 80 and may be attached to the attachment position of the probe card 80. In addition, the probe card type temperature measurement member 90 may measure the temperature of the chuck top 51 by the digital temperature sensors 93 in the state of being attached to the attachment position of the probe card 80. Further, the digital temperature sensors 93 are supplied with electric power from the tester 40 used for electrical characteristic inspection, that is, is driven by the tester 40, and outputs a temperature measurement result to the tester 40. Therefore, according to the present embodiment, when the temperature of the chuck top 51 is measured, it is not necessary for a user, for example, to install a temperature sensor or to detach the tester 40. Therefore, it is possible to safely perform the temperature measurement of the chuck top 51, which is aimed at checking the accuracy of temperature adjustment of the chuck top 51, in a short period of time.

Unlike the present embodiment, when the tester 40 is detached for measuring the temperature of the chuck top 51, not only the electrical characteristic inspection in the tester 40 but also the electrical characteristic inspection in another tester 40 present in the same divided region 13*a* as the tester 40 is interrupted. In contrast, in the present embodiment, since it is unnecessary to detach the tester 40 when measuring the temperature of the chuck top 51, it is possible to improve the throughput of electrical characteristic inspection.

Furthermore, in the present embodiment, the digital temperature sensors 93 are used, and the temperature measurement result of the chuck top 51 is output as a digital signal. Therefore, compared with the case in which the temperature sensors are analog temperature sensors, it is possible to obtain a more accurate temperature measurement result without the influence of noise in the wiring patterns between the temperature sensors and the tester 40 or the influence of noise in the tester 40.

Furthermore, in the present embodiment, since the probes 92 are flexible, even if the height of the chuck top 51 with respect to the main body 91, in the state in which the chuck top 51 is attracted to the pogo frame 70, varies, it is possible to bring the probes 92 and the chuck top 51 into physical contact. In other words, since the probes 92 are flexible, the physical contact between the probes 92 and the chuck top 51 is ensured.

In order to ensure the physical contact, instead of making the probes 92 flexible, the probes 92 may be configured to be extensible by, for example, a piezo element.

In the above description, the temperature of the chuck top 51 in the temperature-adjusted state is measured by the probe card type temperature measurement member 90. Further, the temperature of a wafer W in the temperature-adjusted state may be measured by the probe card type temperature measurement member 90. In measuring the temperature of the wafer W for the purpose of checking the accuracy of temperature adjustment of the wafer W, a bare wafer may be used as the wafer W.

When measuring the temperatures of both the chuck top 51 and the wafer W, it is preferable to provide a probe card type temperature measurement member 90 for the chuck top 51 and a probe card type temperature measurement member 90 for the wafer W separately. This is because if the probe card type temperature measurement member 90 is shared by the chuck top 51 and the wafer W, the heights of the chuck top 51 and the wafer W are different from each other and thus the probe 92 is bent differently when the temperature of the wafer W is measured and when the temperature of the chuck top 51 is measured.

In the above description, the digital temperature sensors 93 are used as the temperature sensors. However, the temperature sensors are not limited to such example, and may be, for example, analog temperature sensors (such as those having a platinum resistance thermometer). In the above-described examples, the temperature sensors are in contact with the chuck top 51, which is a temperature measurement object. That is, the temperature sensors are of a contact type. However, the temperature sensors may be, for example, optical temperature sensors, which are of a non-contact type.

It should be noted that the embodiments and modifications disclosed herein are exemplary in all respects and are not restrictive. The above-described embodiments may be omitted, replaced or modified in various forms without departing from the scope and spirit of the appended claims.

The following configurations also belong to the technical scope of the present disclosure.

(1) A temperature measurement member measures a temperature of an inspection object or a temperature of a mounting table on which the inspection object is placed inside an inspection apparatus that inspects the inspection object. The temperature measurement member is attached to an attachment position of a probe card used for electrical characteristic inspection in the inspection apparatus. The temperature measurement member includes: a main body having substantially a same shape as the probe card; a probe formed to extend from the main body toward the mounting table in a state in which the temperature measurement member is attached to the attachment position; and a temperature sensor provided at a tip end of the probe and configured to measure the temperature of the inspection object or the mounting table, which is a temperature measurement object. The temperature sensor transmits/receives a temperature measurement-related electrical signal to/from an inspection part that transmits/receives the electrical signal to/from the inspection object via the probe card in the electrical characteristic inspection, and transmits a temperature measurement result to the inspection part.

According to item (1), it is unnecessary for the user, for example, to install the temperature sensor or to detach the inspection part at the time of measuring the temperature of the inspection object or the mounting table. Therefore, it is possible to safely perform the temperature measurement of the inspection object and the mounting table, which is aimed at checking the accuracy of temperature adjustment and the like, in a short period of time.

(2) In the temperature measurement member of item (1), the temperature sensor is a digital temperature sensor configured to transmit the temperature measurement result as a digital signal.

According to item (2), it is possible to obtain a more accurate temperature measurement result.

(3) In the temperature measurement member of item (1) or (2), the probe is flexible.

According to item (3), it is possible to ensure physical contact between the probe and the temperature measurement object.

(4) In the temperature measurement member any one of items (1) to (3), the probe has a wiring pattern formed to electrically connect the inspection part and the temperature sensor.

(5) The temperature measurement member of any one of items (1) to (4) further includes a stopper configured to maintain a distance between the inspection object or the mounting table, which is the temperature measurement object, and the main body at a predetermined level or more.

According to item (5), it is possible to prevent the probe from being greatly bent and damaged.

(6) An inspection apparatus including: the temperature measurement member of any one of items (1) to (5); and a transfer part configured to transfer the probe card and the temperature measurement member to the installation position.

(7) A method of the present disclosure measures a temperature of an inspection object or a temperature of a mounting table on which the inspection object is placed inside an inspection apparatus that inspects the inspection object. The inspection apparatus includes: a probe card used for electrical characteristic inspection; a temperature measurement member attached to an attachment position of the probe card and including a main body having substantially a same shape as the probe card, a probe extending from the main body toward the mounting table, and a temperature sensor provided at a tip end of the probe; and a transfer part configured to transfer the probe card and the temperature measurement member. The method includes: transferring, by the transfer part, the temperature measurement member to the attachment position from which the probe card is detached, and attaching the temperature measurement member to the attachment position; supplying power from an inspection part to the temperature sensor via the probe card in the electrical characteristic inspection, measuring the temperature of the inspection object or the mounting table as a temperature measurement object by the temperature sensor, and transmitting a temperature measurement result from the temperature sensor to the inspection part, the inspection part being configured to transmit/receive an electrical signal to/from the inspection object; and detaching the temperature measurement member and unloading the temperature measurement member by the transfer part.

According to the present disclosure, it is possible to safely, in a short period of time, perform temperature measurement aimed at checking accuracy of temperature adjustment for a temperature adjustment object in an inspection apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A temperature measurement member that measures a temperature of an inspection object or a temperature of a mounting table on which the inspection object is placed inside an inspection apparatus that inspects the inspection object,
    wherein the temperature measurement member is attached to an attachment position of a probe card used for electrical characteristic inspection in the inspection apparatus,
    wherein the temperature measurement member comprises:
        a main body having substantially a same shape as the probe card;
        a probe formed to extend from the main body toward the mounting table in a state in which the temperature measurement member is attached to the attachment position; and
        a temperature sensor provided at a tip end of the probe and configured to measure the temperature of the inspection object or the mounting table, which is a temperature measurement object, and
    wherein the temperature sensor transmits/receives a temperature measurement-related electrical signal to/from an inspection part that transmits/receives the electrical signal to/from the inspection object via the probe card in the electrical characteristic inspection, and transmits a temperature measurement result to the inspection part.

2. The temperature measurement member of claim 1, wherein the temperature sensor is a digital temperature sensor configured to transmit the temperature measurement result as a digital signal.

3. The temperature measurement member of claim 2, wherein the probe is flexible.

4. The temperature measurement member of claim 3, wherein the probe has a wiring pattern formed to electrically connect the inspection part and the temperature sensor.

5. The temperature measurement member of claim 4, further comprising:
    a stopper configured to maintain a distance between the inspection object or the mounting table, which is the temperature measurement object, and the main body at a predetermined level or more.

6. The temperature measurement member of claim 1, wherein the probe is flexible.

7. The temperature measurement member of claim 1, wherein the probe has a wiring pattern formed to electrically connect the inspection part and the temperature sensor.

8. The temperature measurement member of claim 1, further comprising:
    a stopper configured to maintain a distance between the inspection object or the mounting table, which is the temperature measurement object, and the main body at a predetermined level or more.

9. An inspection apparatus comprising:
    the temperature measurement member of claim 1; and
    a transfer part configured to transfer the probe card and the temperature measurement member to an installation position.

10. A method of measuring a temperature of an inspection object or a temperature of a mounting table on which the inspection object is placed inside an inspection apparatus that inspects the inspection object,
    wherein the inspection apparatus comprises:
    a probe card used for electrical characteristic inspection;
    a temperature measurement member attached to an attachment position of the probe card and including a main body having substantially a same shape as the probe card, a probe extending from the main body toward the mounting table, and a temperature sensor provided at a tip end of the probe; and
    a transfer part configured to transfer the probe card and the temperature measurement member, and
    wherein the method comprises:
    transferring, by the transfer part, the temperature measurement member to the attachment position from which the probe card is detached, and attaching the temperature measurement member to the attachment position;
    supplying power from an inspection part to the temperature sensor via the probe card in the electrical characteristic inspection, measuring the temperature of the inspection object or the mounting table as a temperature measurement object by the temperature sensor, and transmitting a temperature measurement result from the temperature sensor to the inspection part, the inspection part being configured to transmit/receive an electrical signal to/from the inspection object; and
    detaching the temperature measurement member and unloading the temperature measurement member by the transfer part.

* * * * *